United States Patent
Basol et al.

(10) Patent No.: US 7,201,829 B2
(45) Date of Patent: Apr. 10, 2007

(54) MASK PLATE DESIGN

(75) Inventors: Bulent M. Basol, Manhattan Beach, CA (US); Cyprian Uzoh, Milpitas, CA (US); Jeff A. Bogart, Los Gatos, CA (US)

(73) Assignee: Novellus Systems, Inc., San Jose, CA (US)

( * ) Notice: Subject to any disclaimer, the term of this patent is extended or adjusted under 35 U.S.C. 154(b) by 820 days.

(21) Appl. No.: 09/960,236

(22) Filed: Sep. 20, 2001

(65) Prior Publication Data

US 2002/0121445 A1 Sep. 5, 2002

Related U.S. Application Data

(60) Provisional application No. 60/272,791, filed on Mar. 1, 2001.

(51) Int. Cl.
C25F 3/16 (2006.01)
C25F 5/00 (2006.01)
C25D 17/00 (2006.01)

(52) U.S. Cl. ............... 204/224 M; 204/224 R; 204/242; 204/275.1; 204/284; 205/123; 205/137; 205/291; 205/651; 205/662; 205/663; 451/28; 451/177

(58) Field of Classification Search ............... 204/242, 204/224 R, 224 M, 229.4, 229.8, 275.1, 284; 205/137, 81, 640, 123, 291, 651, 662–663; 451/41, 28, 177
See application file for complete search history.

(56) References Cited

U.S. PATENT DOCUMENTS

| 4,631,220 A | 12/1986 | Clifton |
| 5,807,165 A * | 9/1998 | Uzoh et al. ............ 451/41 |
| 6,066,030 A | 5/2000 | Uzoh ............ 451/41 |
| 6,159,088 A | 12/2000 | Nakajima ............ 451/527 |
| 6,176,992 B1 | 1/2001 | Talieh ............ 205/87 |
| 6,261,426 B1 * | 7/2001 | Uzoh et al. ............ 204/224 R |
| 6,270,646 B1 | 8/2001 | Walton et al. ............ 205/93 |
| 6,406,363 B1 | 6/2002 | Xu et al. |
| 6,413,388 B1 * | 7/2002 | Uzoh et al. ............ 204/224 R |
| 6,609,961 B2 | 8/2003 | Lacy et al. |
| 6,612,915 B1 * | 9/2003 | Uzoh et al. ............ 451/285 |
| 6,932,896 B2 * | 8/2005 | Basol et al. ............ 205/93 |
| 7,074,113 B1 * | 7/2006 | Moore ............ 451/28 |
| 2002/0108861 A1 | 8/2002 | Emesh et al. ............ 205/81 |
| 2002/0130049 A1 * | 9/2002 | Chen et al. ............ 205/640 |
| 2002/0134748 A1 * | 9/2002 | Basol et al. ............ 216/13 |

FOREIGN PATENT DOCUMENTS

| WO | WO 00/59682 | 10/2000 |
| WO | WO 01/63018 | 8/2001 |

\* cited by examiner

*Primary Examiner*—Roy King
*Assistant Examiner*—Lois Zheng
(74) *Attorney, Agent, or Firm*—Knobbe Martens Olson & Bear

(57) ABSTRACT

The present invention includes a mask plate design that includes at least one or a plurality of channels portions on a surface of the mask plate, into which electrolyte solution will accumulate when the mask plate surface is disposed on a surface of wafer, and out of which the electrolyte solution will freely flow. There are also at least one or a plurality of polish portions on the mask plate surface that allow for polishing of the wafer when the mask plate surface is disposed on a surface of wafer.

31 Claims, 15 Drawing Sheets

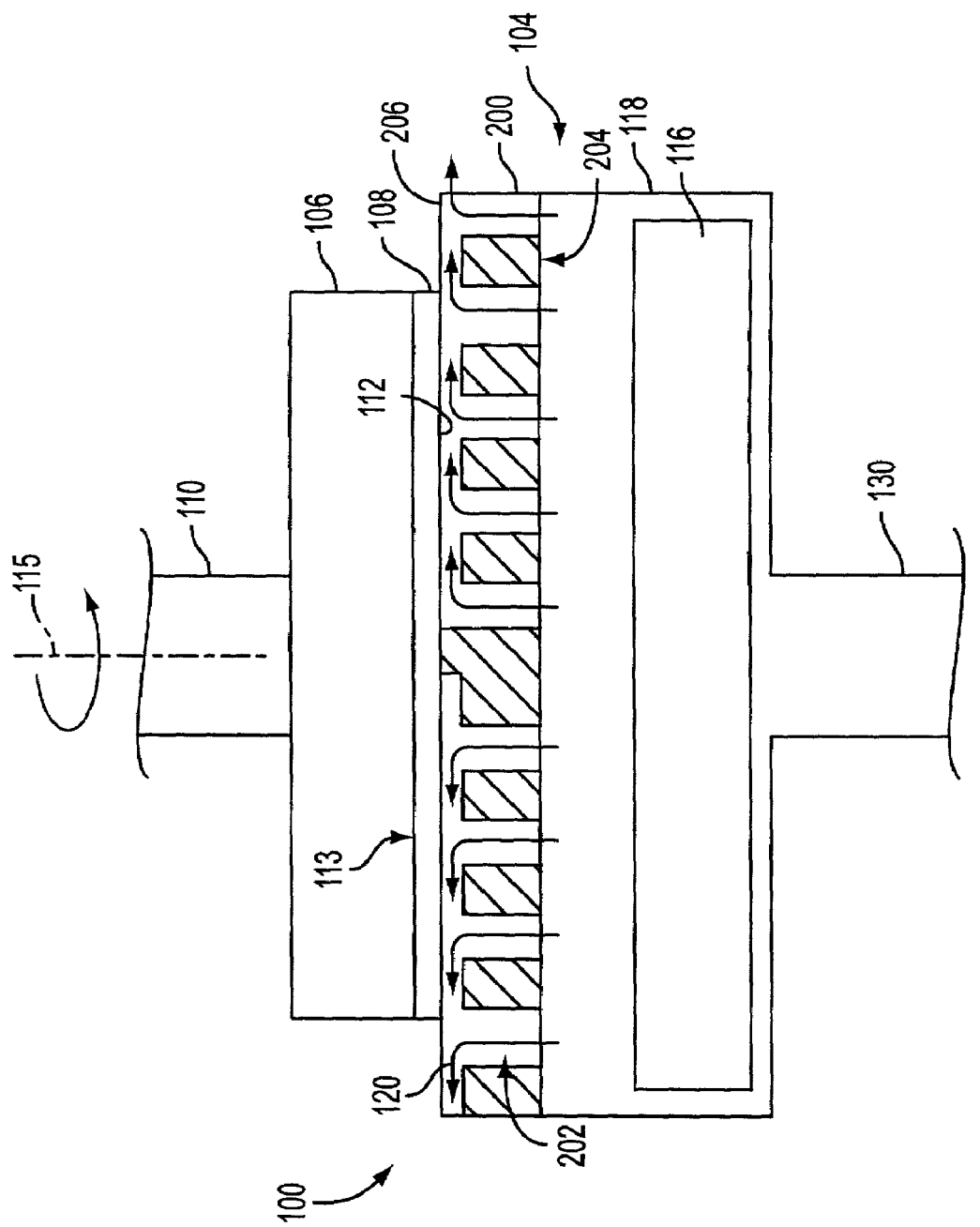

MASK PLATE DESIGN

This application claims benefit of U.S. Patent Ser. No. 60/272,791, filed on Mar. 1, 2001.

FIELD OF THE INVENTION

The present invention relates to a mask plate design usable in a plating process.

BACKGROUND OF THE INVENTION

Conventional semiconductor devices generally include a semiconductor substrate, usually a silicon substrate, and a plurality of sequentially formed dielectric interlayers such as silicon dioxide and conductive paths or interconnects made of conductive materials. The interconnects are usually formed by filling a conductive material in trenches etched into the dielectric interlayers. In an integrated circuit, multiple levels of interconnect networks laterally extend with respect to the substrate surface. The interconnects formed in different layers can be electrically connected using vias or contacts. A conductive material filling process of such features, i.e., via openings, trenches, pads or contacts can be carried out by depositing a conductive material over the substrate including such features.

Copper and copper alloys have recently received considerable attention as interconnect materials because of their superior electromigration and low resistivity characteristics. The preferred method of copper deposition is electrodeposition. During fabrication, copper is deposited on the substrate that has been previously coated with a barrier layer and then a seed layer. Typical barrier materials generally include tungsten, tantalum, titanium, their alloys, and their nitrides. The deposition process can be carried out using a variety of processes. After depositing copper into the features on the semiconductor wafer surface, an etching, an electro polishing or a chemical mechanical polishing (CMP) step may be employed. These processes remove the conductive materials off the field regions of the surface, thereby leaving the conductive materials only within the via, trench and other features. During such removal processes, the use of electrodeposition processes that yield planar and defect free copper layers prevents material losses improves throughput while reducing cost.

The importance of overcoming the various deficiencies of the conventional electrodeposition techniques is evidenced by technological developments directed to the deposition of planar copper layers. U.S. Pat. No. 6,176,992 to Talieh, entitled "Method and Apparatus for Electrochemical Mechanical Deposition" and commonly owned by the assignee of the present invention, describes in one aspect an electro chemical mechanical deposition technique (ECMD) that achieves deposition of the conductive material into the cavities on the substrate surface while minimizing deposition on the field regions by polishing the field regions with a pad as the conductive material is deposited, thus yielding planar copper deposits.

U.S. application Ser. No. 09/740,701 now U.S. Pat. No. 6,534,116 entitled "Plating Method and Apparatus that Creates a Differential Between Additive Disposed on a Top Surface and a Cavity Surface of a Workpiece Using an External Influence," also assigned to the same assignee as the present invention, describes in one aspect a method and apparatus for plating a conductive material onto the substrate by creating a external influence, such as causing relative movement between a workpiece and a mask, to cause a differential in additives to exist for a period of time between a top surface and a cavity surface of a workpiece. While the differential is maintained, power is applied between an anode and the substrate to cause greater relative plating of the cavity surface than the top surface.

U.S. application Ser. No. 09/735,546 now U.S. Pat. No. 6,482,307 entitled "Method and Apparatus For Making Electrical Contact To Wafer Surface for Full-Face Electroplating or Electropolishing" filed on Dec. 14, 2000 describes in one aspect a technique for providing full face electroplating or electropolishing. And U.S. application Ser. No. 09/760,757 now U.S. Pat. No. 6,610,190 entitled "Method and Apparatus for Electrodeposition of Uniform Film with Minimal Edge Exclusion on Substrate" filed on Jan. 17, 2001 describes in one aspect a technique for forming a flat conductive layer on a semiconductor wafer surface without losing space on the surface for electrical contacts.

Further, U.S. patent application Ser. No. 09/511,278 now U.S. Pat. No. 6,413,388 entitled "Pad Designs and Structures for a Versatile Materials Processing Apparatus" filed Feb. 23, 2000, and U.S. patent application Ser. No. 09/621,969 now U.S. Pat. No. 6,413,403 entitled "Pad Designs and Structures With improved Fluid Distribution" filed Jul. 21, 2000, and both assigned to the same assignee as the present invention, describe, among other aspects, pad designs that assist in providing surface with a uniform material overburden. In particular, FIG. 12 of U.S. patent application Ser. No. 09/511,278 shows channels in the form of slits 120 and circular openings 121.

While these techniques assist in obtaining planar metal deposits on wafers, there is still a need for further development of high-throughput techniques and devices that can yield planar metal deposits with better uniformity.

SUMMARY OF THE INVENTION

It is an object of the present invention to provide a mask plate design that assists in providing planar metal deposits with better uniformity.

It is a further object of the present invention to provide a mask plate design with channels therein that provide for a uniform application of electrolyte solution.

Another object of the invention is to provide for a mask plate design with radially disposed channels.

In order to attain the above objects, among others, either taken separately or in combination, the present invention includes a mask plate design that includes at least one or a plurality of channels portions on a surface of the mask plate, into which electrolyte solution will accumulate when the mask plate surface is disposed on a surface of wafer, and out of which the electrolyte solution will freely flow. There are also at least one or a plurality of polish portions on the mask plate surface that allow for polishing of the wafer when the mask plate surface is disposed on a surface of wafer.

In one embodiment, radially arranged and dimensioned holes within a radially arranged and dimensioned channel portion allow for a flow of electrolyte solution therethrough, so that plating of the workpiece can occur in an area corresponding to the location of the channel portion, while polishing can occur within an area of the workpiece corresponding to the location of the polish portion.

In another embodiment, a plurality of parallel slit channel portions are arranged and dimensioned to allow a flow of electrolyte solution therethrough, so that plating of the workpiece can occur within an area corresponding to the location of the channel portion, while polishing of the workpiece can occur at an area corresponding to the location of the polish portion.

The mask plate design as described can be used in a variety of plating processes, preferably mask pulse plating and electrochemical mechanical deposition.

BRIEF DESCRIPTION OF THE DRAWINGS

The above and other objectives, features, and advantages of the present invention are further described in the detailed description which follows, with reference to the drawings by way of non-limiting exemplary embodiments of the present invention, wherein like reference numerals represent similar parts of the present invention throughout several views and wherein:

FIGS. 6A–6B illustrate perspective and cross sectional views of a preferred embodiment of a plating and/or electropolishing apparatus according to the present invention;

DETAILED DESCRIPTION OF THE PREFERRED EMBODIMENTS

As will be described below, the present invention provides a plating device to plate a planar conductive material layer on a surface of a semiconductor. The invention described herein has particular applicability to the mask pulse plating process described above with reference to U.S. application Ser. No. 09/740,701 now U.S. Pat. No. 6,534,116 entitled "Plating Method and Apparatus that Create a Differential Between Additive Disposed on a Top Surface and a Cavity Surface of a Workpiece Using an External Influence, and with the electrochemical mechanical deposition (ECMD) process described in U.S. Pat. No. 6,176,992 to Talieh, although other processes, including modifications to conventional plating techniques. The mask plate device of the present invention advantageously enables deposition of a high quality conductive material in a plurality of surface features or cavities, such as trenches, vias, contact holes and the like, on a surface of a semiconductor wafer, even if the aspect ratio is large.

In one embodiment, the present invention achieves deposition of the conductive material through the mask plate into the surface features of the wafer while minimizing the deposition on the top surface regions between the features by contacting, sweeping and/or polishing of the wafer surface with the mask plate. For systems that can deposit planar films, i.e., ECMD, mask pulse plating and full face plating, the thickness uniformity can be controlled to a certain extent through designing the shape and location of the openings in the mask, pad or shaping plates that are employed.

The present invention can also be used with an electrochemical polishing system, also referred to as an electrochemical etching system, in which instead of plating a conductive material on a wafer surface, conductive material can be removed from the workpiece surface. Accordingly, while their are examples provided below of both electrochemical mechanical deposition systems (including ECMD, mask pulse plating and full face plating) and electrochemical polishing systems, it will be understood that the present invention can be applied to both types of systems, which will be generically referred to as electrochemical processing or an electrochemical processing system.

Figure 1A:
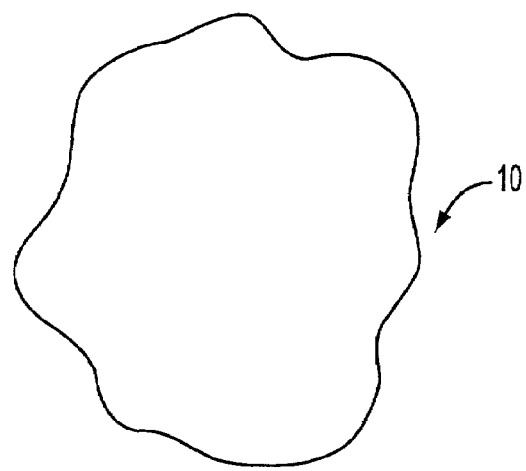
FIGS. 1A and 1B illustrate a portion of an exemplary substrate operated upon by the present invention.
Figure 1B:
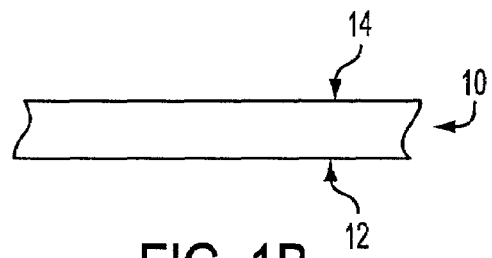

Reference will now be made to the drawings wherein like numerals refer to like parts throughout. FIGS. 1A and 1B illustrate a portion of an exemplary substrate 10, preferably a silicon wafer portion, to be plated with a conductor metal, preferably copper. The substrate 10, including the portion illustrated, includes a front surface 12 to be plated with copper and a bottom surface 14 to be held by a carrier head that will be described below.

Figure 2A:
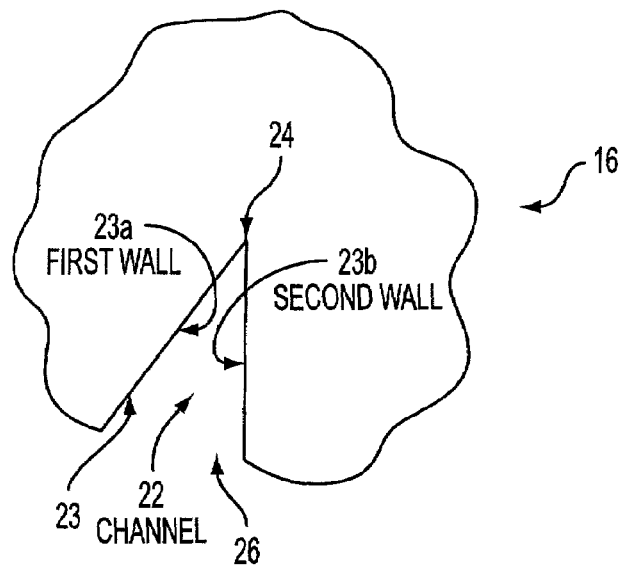
FIGS. 2A–2B illustrate a portion of a mask plate according to the present invention.
Figure 2B:
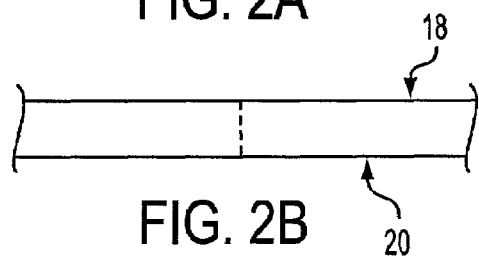

FIGS. 2A–2B exemplifies a mask plate portion 16 of the present invention that includes a top surface 18 and a bottom surface 20. The mask plate 16 also includes a channel 22 extending between the top and the bottom surfaces 18, 20 and having a radially arranged shape, which can be obtained, for example, by a 'V' shaped side wall 23 having a first wall 23a and a second wall 23b. The channel also laterally extends between a closed end 24 and an open end 26.

Figure 3A:
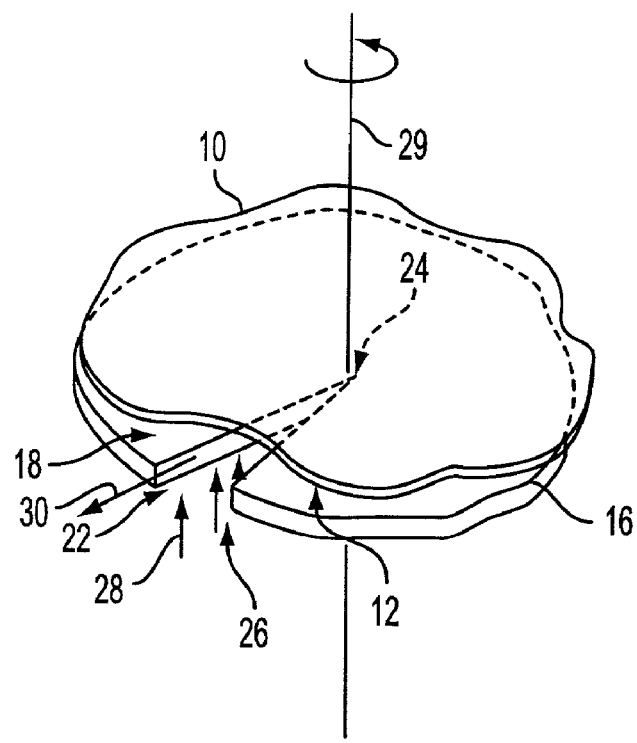
FIGS. 3A–3B illustrate the relative relationship between the substrate and the mask plate when plating or polishing according to the present invention.

"As shown in FIG. 3A, during the electroplating process the front surface 12 of substrate 10 is brought into contact with the top surface 18 of the mask plate 16. As a plating solution, depicted by arrow 28, is delivered to the channel 22, the substrate 10 is rotated about a rotation axis 29 while the front surface 12 contacts the top surface 18 of the mask plate 16. For the purpose of clarification, the rotation axis 29 may be the point at which the closed end 24 of the channel 22, thereby ensuring that rotation of the substrate 10 will result in the entire front surface 12 of the substrate 10 having uniform contact with the channel 22. As the solution is delivered and fills the channel 22, it wets the front surface 12 of the substrate 10. As will be described in detail below, under an applied potential between the substrate and an anode, in the presence of the solution 28 that fills the channel 22, the metal, such as copper, is plated on the front surface 12 of the substrate and the front surface 12 of the substrate is also swept by the top surface 18 of the plate 16. This sweeping of the top surface 18 of the plate 16 assists in obtaining planar deposition of the metal. The solution 28, which is continuously delivered under pressure, will then flow through the channel 22 in the direction of the arrow 30, towards the open end 26, and exits the plate 16."

It is noted that the above description described rotation and movement of the substrate 10, assuming that the plate 16 was stationary. It is understood that the present invention, as described above, as well as below, will allow for either the substrate or the plate to move, or for both of them to move, thereby creating the same relative affect. For ease of description, however, the invention was above-described and will continue to be described in terms of movement of the substrate.

Figure 3B:
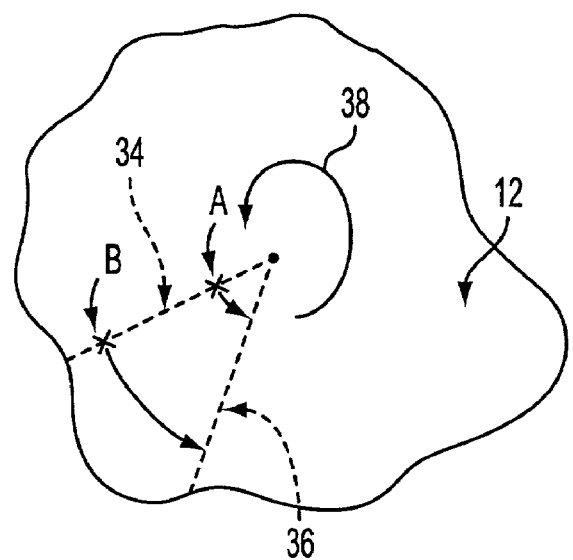

FIG. 3B exemplifies how the uniform plating process through the channel 22 progresses as the substrate 10 is rotated about the rotation axis 29 on the mask plate 16 as described above and illustrated in FIG. 3A. The deposition that occurs in the channel 22 can be exemplified as the metal deposition progresses between a first radial position 34 and a second radial position 36 on the substrate 10. As the substrate 10 is rotated in a first rotation direction 38 on the mask plate 16, a first reference point 'A' on the first rotational position 34 receives deposition of the metal until the point 'A' reaches the second rotational position 36. For purpose of this discussion, it is noted that the reference point 'A' is closer to the center of the substrate 10 than a second reference point 'B' shown on the first rotational position 34 as the wafer rotated up to the second rotational position 36. Due to the fact that the point 'B' rotates faster than the point 'A' on the substrate 10, both points 'A' and 'B' receive equal amount of the metal being deposited if the metal flux coming through the channel 22 is constant. This results in a uniform metal layer on the substrate 10, except potentially at an area at the center of the substrate 10 or the area adjacent the closed end 24 of the channel 22 which may not have received sufficient plating solution. This potential plating anomaly at the center of the substrate may be minimized or eliminated by providing a slight lateral motion to the substrate 10 as it is rotated.

Figure 4A:
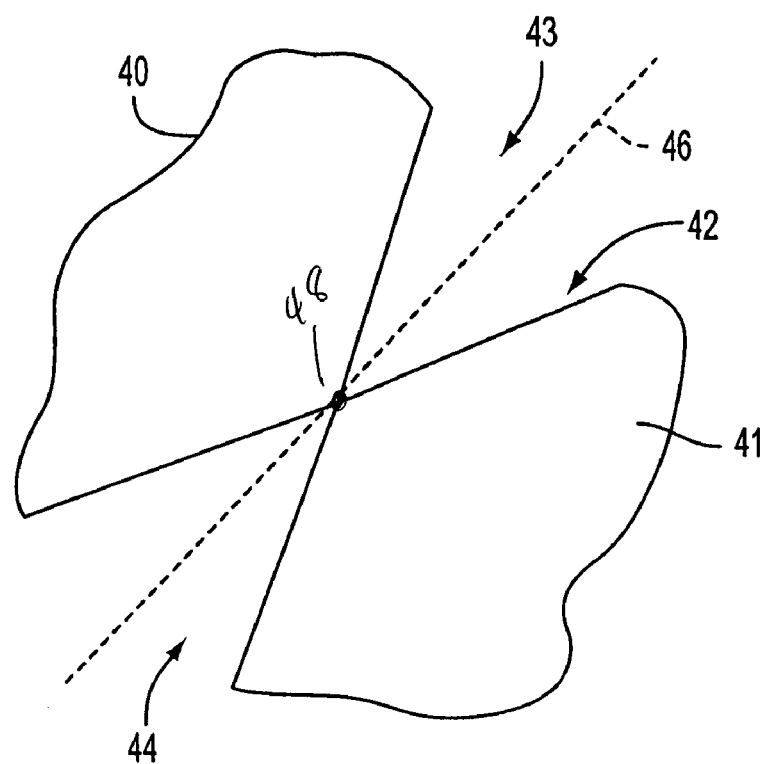
FIGS. 4A–4B illustrate a portion of another mask plate according to the present invention, and the relative motion introduced during operation thereof.
Figure 4B:
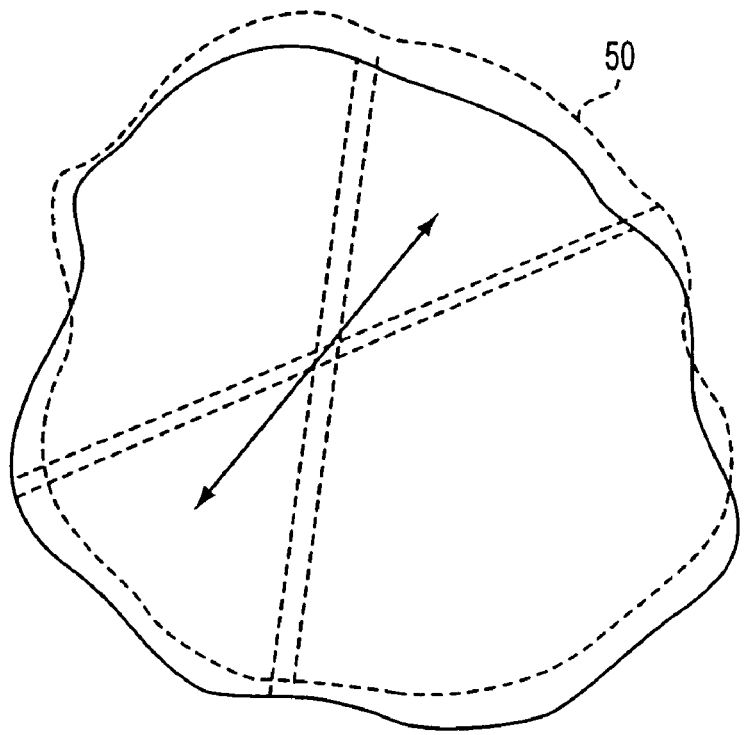

As illustrated in FIG. 4A, an alternative mask plate portion 40 having a top surface 41 includes a channel system 42. The channel system 42 includes a plurality of radially arranged channels, shown for example as first and second channels 43 and 44, respectively. Although the location of the channels 43 and 44 are shown as being 180° opposite from each other, that is not needed. The location of the channels 43 and 44 can be at different radial locations with respect to each other, and more than just two such channels can be made as well. The channels 43 and 44 preferably have the same size and shape and are formed along an axis 46 of symmetry as in the manner shown in FIG. 4A. Since the center point 48 may inhibit deposition at a corresponding region of the substrate 50, in addition to the rotation of the substrate 50, the substrate 50 is also moved laterally moved along the symmetry axis 46 to expose the region on the substrate 50 that is blocked by the center point 48.

Figure 5A:
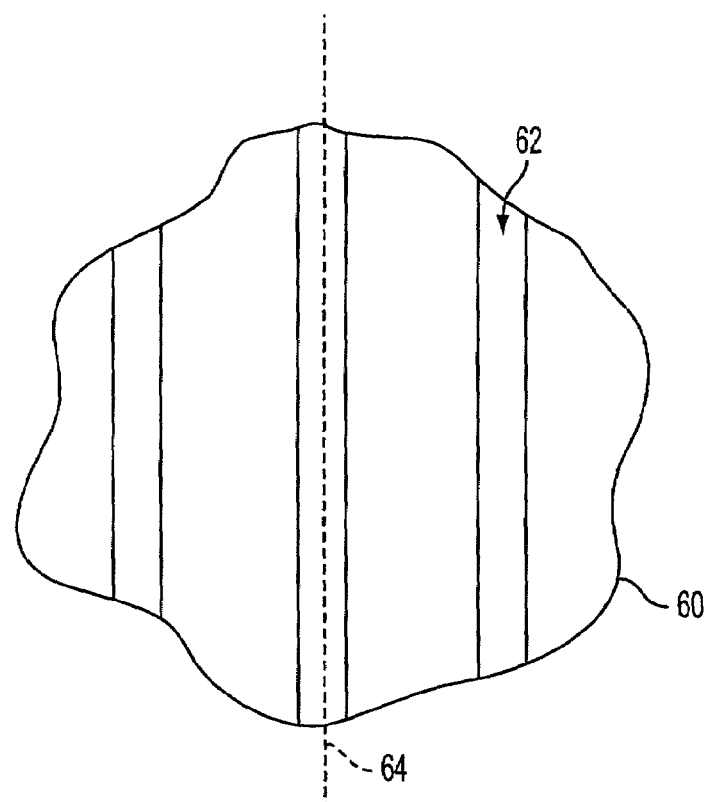
FIGS. 5A–5B illustrate a portion of another mask plate according to the present invention.
Figure 5B:
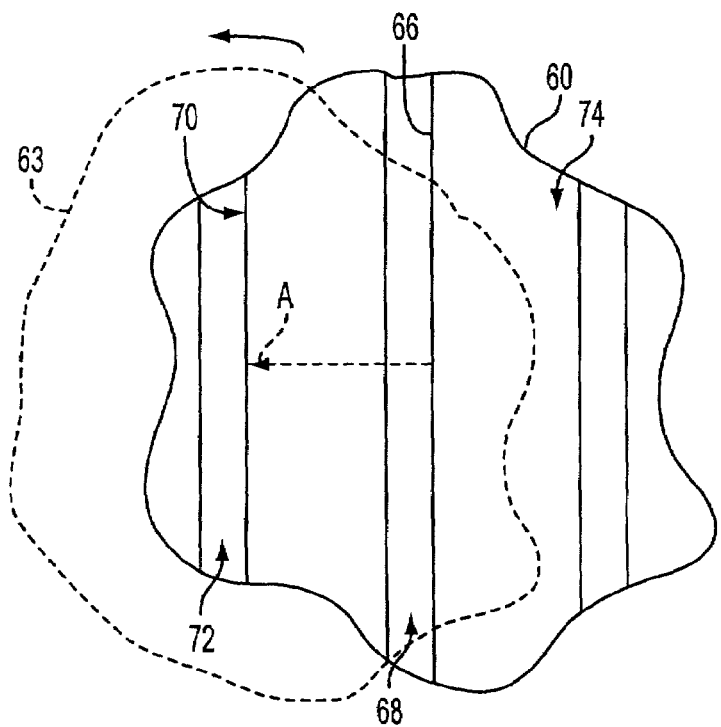

FIGS. 5A–5B shows another alternative mask plate portion 60 having channels 62 extending parallel to an axis 64 of the mask plate 60. In this design, the channels 62 may be formed as long narrow cuts, openings or slits. During the deposition process, a substrate 63 shown in FIG. 5B may be placed on the mask plate 60 as described for the above embodiments. Due to the shape of the channels 62, however, the substrate 63 is moved laterally and in a direction substantially perpendicular to the axis 64 while also being slowly rotated. Lateral motion to the substrate 63 may be given by pulsing, or moving with a series of reciprocating strokes, the substrate 63 back and forth laterally on the mask plate 60. As shown in FIG. 5B, during the deposition, for example, the lateral pulse is such arranged that each stroke may translate a point 'A' on the substrate 63 from a first position to a second position on the mask 60. The first position may be adjacent a first wall 66 of a first channel 68 of the mask 60 while the second position may be adjacent to a first wall 70 of a second channel 72. In each stroke a top surface 74 of the mask 60 sweeps the depositing layer and provides planarity. Although in this example, the point 'A' is shown to have moved between two adjacent channels, it is preferred that the point 'A' moves over more than one channel, such as three or four channels, with each stroke, thereby ensuring better planarity. The slow radial motion, typically with a rotational component that is in the range of above 0 to 10 RPM and with a linear component of 0.5 to 50 mm/sec, further contributes to the depositing layer uniformity by sweeping the substrate surface rotationally.

Figure 5C:
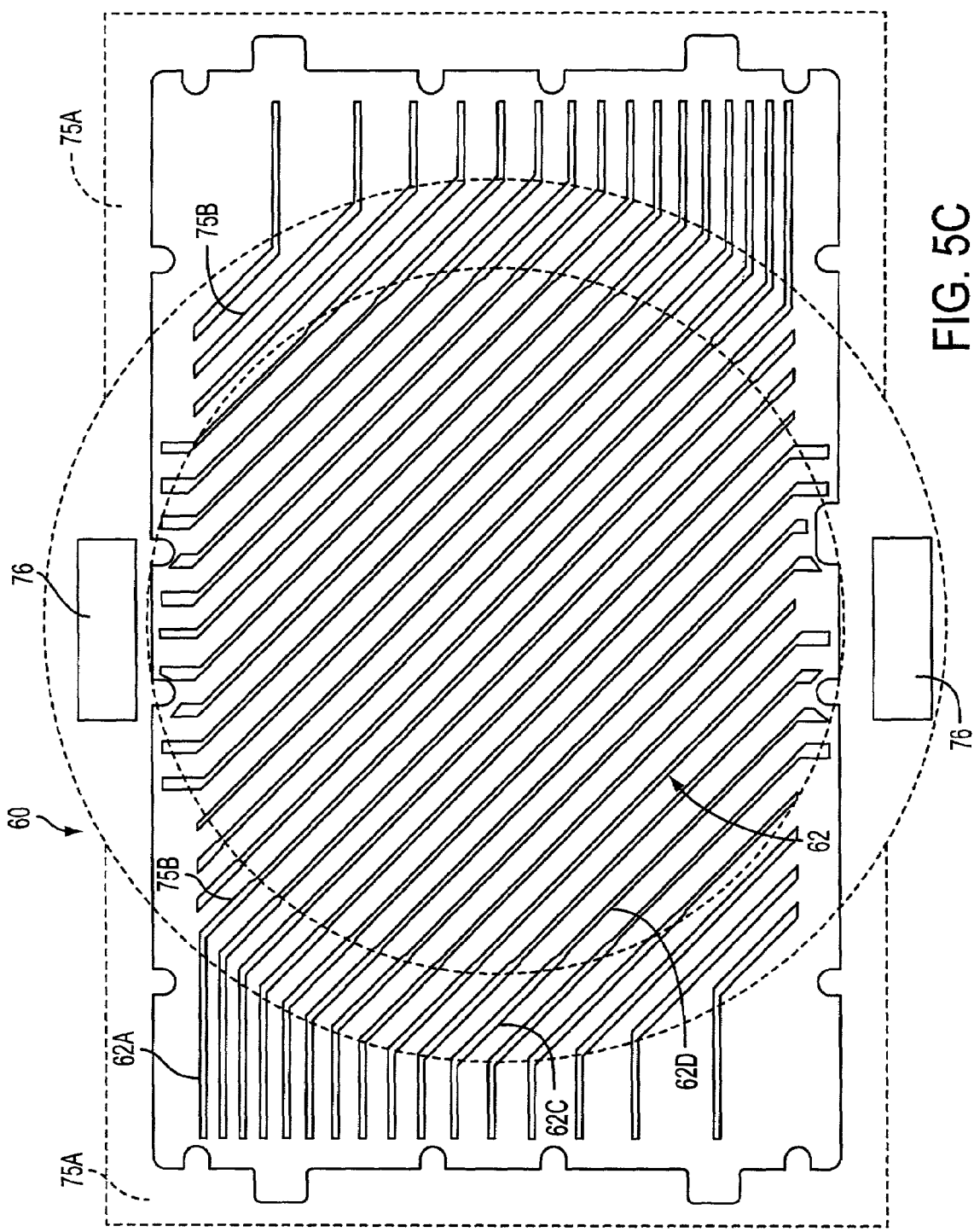
FIG. 5C illustrates a top view of a another mask plate according to the present invention.

FIG. 5C shows a top view of another mask plate 60, with the entire mask, including peripheral portions 75. Of the peripheral portions, there are peripheral portions 75A that will not contact the workpiece, and peripheral portions 75B that will contact the workpiece. As illustrated, each of the channels 62 may be formed as long narrow cuts, openings or slits, and each of the channels have at least one channel edge portion 62A that terminates in one of the peripheral portions 75A that will not contact the workpiece. As illustrated, substantially all of the channel includes the continuous slit, although portions of the channel must include the mask plate material for stability of the entire mask plate. As a result, the flow of the electrolyte within each of the channels 62 can be controlled within the channel and the electrolyte can be removed through the channel edge portion 62A, so that electrolyte does not build up within the channel 62.

Further, for the embodiment illustrated in FIG. 5C in which there will exist electrical contacts 76, preferably at each of the two edge portions of the mask plate 60, it is illustrated that the outer portion 62C of each channel 62, corresponding to that portion of the workpiece that will at some points in time be disposed over the electrical contacts 76 rather than the mask 60, is wider than the inner portion 62D of each channel 62 that will, in operation, always be disposed over the mask 60 and will not be disposed over the electrical contacts 76.

Figure 6A:
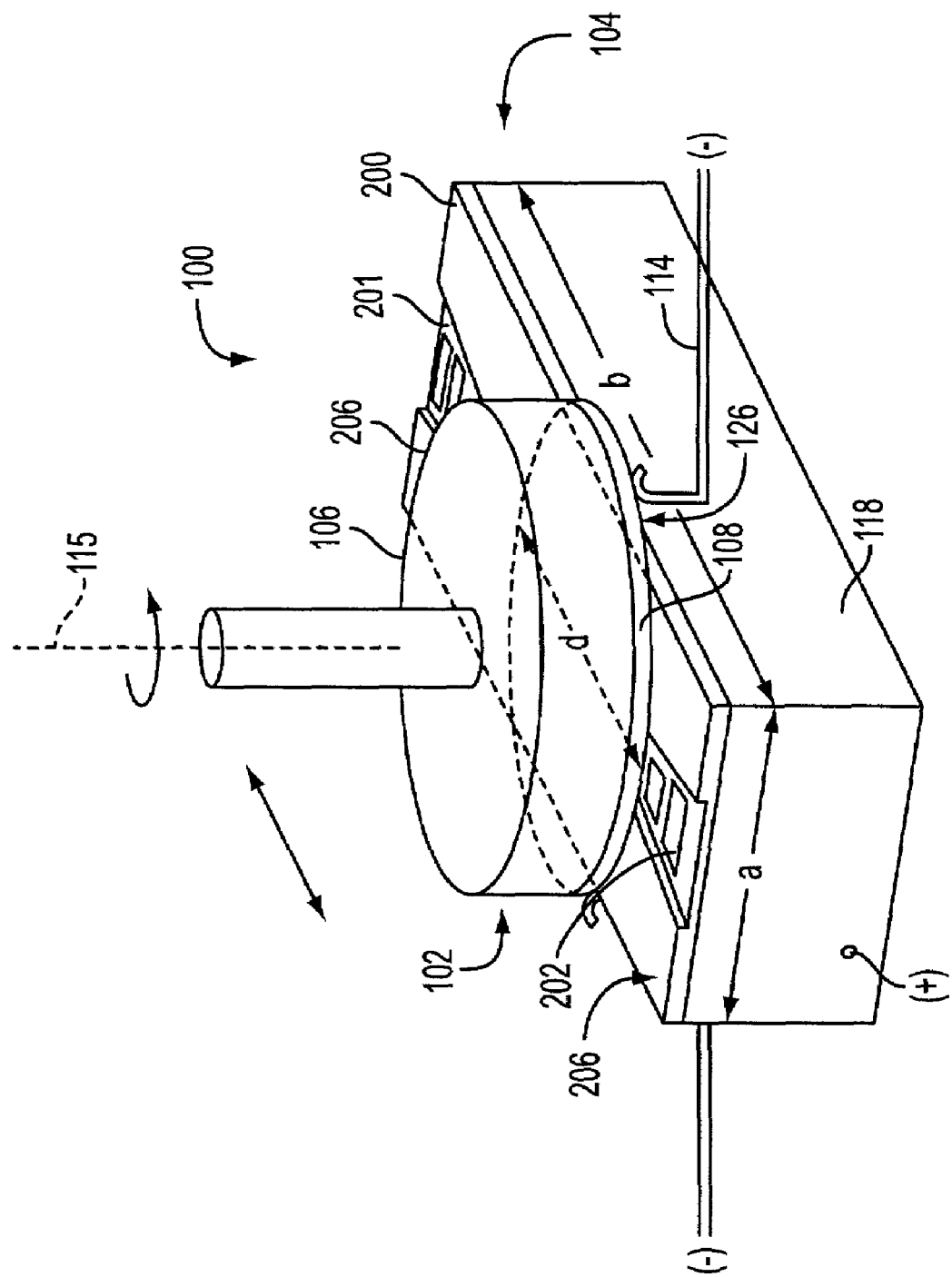

An example of a planar polishing apparatus that can be used to practice the present invention is schematically shown in FIGS. 6A and 6B. As shown in FIG. 6A, in perspective view, an electrodeposition system 100 of the present invention may preferably include a cathode assembly 102 and an anode assembly 104. When used as an electropolishing system, the anode and cathode become reversed, as is known. When used for electrodeposition, the system 100 can deposit a conductive material such as copper on a workpiece such as semiconductor wafer. Although copper is used as an example, the present invention may be used for deposition of other common conductors, for example Ni, Pd, Pt, Au, Pb, Sn, Ag and their alloys. The cathode assembly 102 of the electrodeposition system 100 includes a wafer carrier 106, shown in FIGS. 6A and 6B holding an exemplary wafer 108, i.e., cathode. A front surface 112 of the wafer 108 is connected to a negative terminal of a power supply (not shown) by electrical contact members 114. The wafer carrier 106 holds the wafer 108 from a back surface 113 of the wafer 108. The wafer 108 may be held on a chuck face of the wafer carrier 106 as in the manner shown in FIG. 6B. The wafer 108 may be held using vacuum suction or a retaining ring (not shown) or both, thereby fully exposing a front surface 112 of the wafer 108. During the process, the wafer carrier 106 and hence the wafer 108 are moved by rotating a carrier shaft 110 about a rotation axis 115 or vertical axis and/or by laterally translating the carrier shaft 110.

The anode assembly 104 of the system 100 includes an anode 116, preferably a consumable copper anode, and a mask plate 200. The anode 116 may preferably be placed into an enclosure such as an anode cup 118, which may be enclosed by the mask plate 200 in the manner shown in FIGS. 6A–6B. The anode 116 may have holes that allow the electrolyte to flow therethrough (not shown). Additionally, the anode 116 may have an anode bag or filter around or over the anode to filter particles created during the deposition process. The mask plate 200 and the anode cup 118 may have bleeding openings (not shown) to control the amount of the flow of electrolyte. The mask plate 200 may, for example, have dimensions with length denoted as 'b' and width denoted as 'a', where 'b' is larger than 'a'. In the system 100, 'a' dimension of the mask plate 200 is preferably shorter than the diameter 'd' of the wafer 108. The anode 116 is connected to a positive terminal of the power supply (not shown) and to dispose of gas bubbles that may have been in the anode cup and under the mask plate.

As illustrated in FIGS. 6A–6B, the mask plate 200 is a perforated plate that may comprise a channel system 201 having plurality of holes 202. This mask plate is further described with reference to FIGS. 7A and 7B below. The holes 202 allow a plating electrolyte 120 of the present invention to flow through the mask 200 in the direction of arrows. The holes 202 extend between a bottom 204 and a top 206 of the mask plate 200. As the electrolyte 120 reaches the top 206 of the mask plate 200, the it wets the front surface 112 of the wafer 108 and deposits material on the front surface 112 under applied potential.

During the electrodeposition process, the wafer front surface 112 is kept substantially parallel to the top 206 of the mask plate 200 and rotated. It is understood, as noted above, that the relative motion between the wafer front surface 112 and the top 206 of the mask plate 200 is what is desired, irrespective of how that is achieved. As also mentioned above, this motion can be a purely rotational motion or a rotational motion with linear translation. Depending on the functionality of the mask plate 200, the mask plate 200 may be made of an insulating material or a conductive material, as long as the top 206 of the mask 200 an insulating material. The top 206 may optionally contain abrasive materials.

In the system 100, electrical contact members 114 contact wafer 108 on a contact region 126, as shown in FIG. 6A. The contact region 126 is a peripheral ring region on the front surface of the wafer that has a portion thereof that is always exposed over the edge of the mask plate 200 as the wafer is rotated. The contact region 126 can be located within the area formed by the difference between the 'd' diameter of the wafer 108 and the 'a' width of the mask plate 200, which enables electrical contacts to touch to front surface of the wafer 108. The rotational motion advantageously moves the portion of the contact region 126 that makes electrical contact with the contacts, and thus exposes the contact region 126 to the electrolyte 120 flowing through the mask plate 200. It should be noted that plating only occurs on the wafer 108 at locations corresponding to the holes 202 of the mask plate 200. The combined effect of both the full exposure of the front surface of the wafer 108 and the ability to continuously expose a portion of the contact region 126 to the electrolyte results in zero edge exclusion on the wafer 108.

The contact members 114 may be manufactured in a variety of configurations such as brushes, pins, rollers, flat surfaces and the like. Contact members 114 should be well isolated from the anode. Contact members 114 should be preferably stationary and the contact region 126 should be sliding over them. Contact members 114 may also move with the wafer 108. Contact members 114 are preferably made of or coated with flexible and corrosion resistant conductive materials such as platinum, ruthenium, rhodium and nitrides of refractory materials and such. Since no prior art clamp is used to establish electrical contact with the front surface 112 of the wafer 108, edge exclusion during the deposition is advantageously reduced down to zero. Possible scratching of the contact areas by contact members can be avoided or minimized by assuring that the force applied by the contact members against the contact regions is minimal.

During the planar electroplating deposition process, the electrolyte 120 is pumped into the anode cup 118 through a liquid inlet 130 so as to reach and wet the front surface 112 of the wafer 108 by flowing through the mask plate 200. Under applied voltage, a high quality layer of metal plates out of the plating electrolyte onto the wafer front surface 112. In operation, the cathode assembly 102 may be lowered toward the anode assembly 104 and the front surface 112 of the wafer 108 is contacted with the top 206 of the mask plate 200 while the wafer 108 is rotated. During this process, addition of mechanical polishing or sweeping provides substantially flat deposition layers with controlled thickness.

Figure 7A:
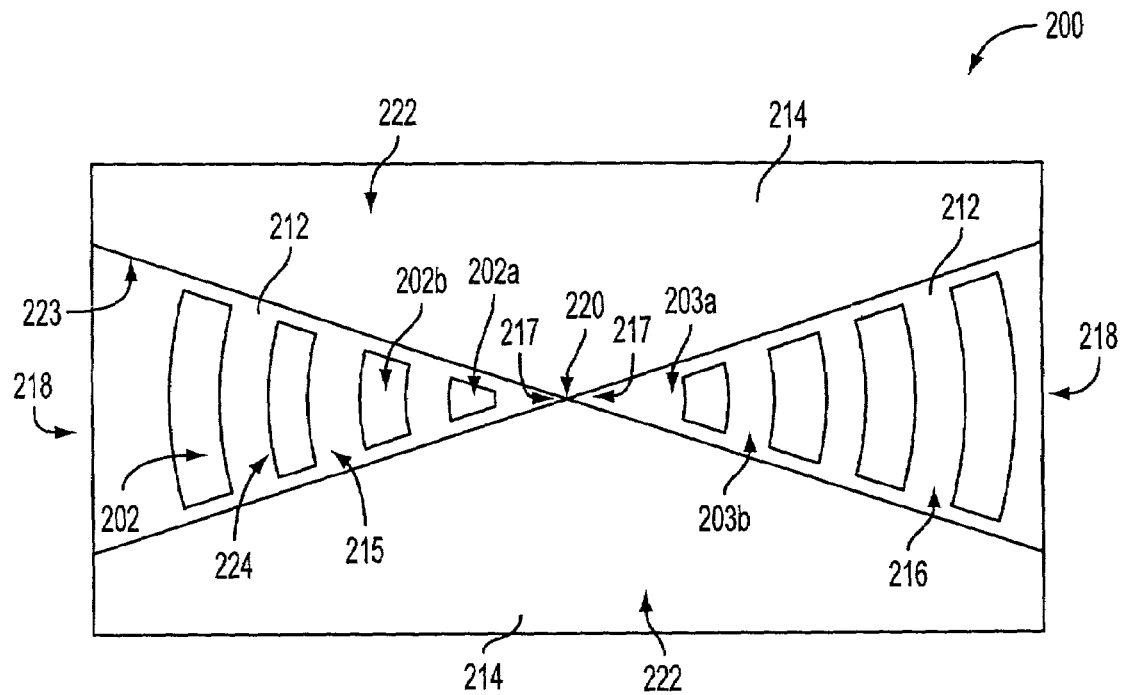
FIGS. 7A–7B illustrate perspective and cross sectional views of a mask plate according to present invention.
Figure 7B:
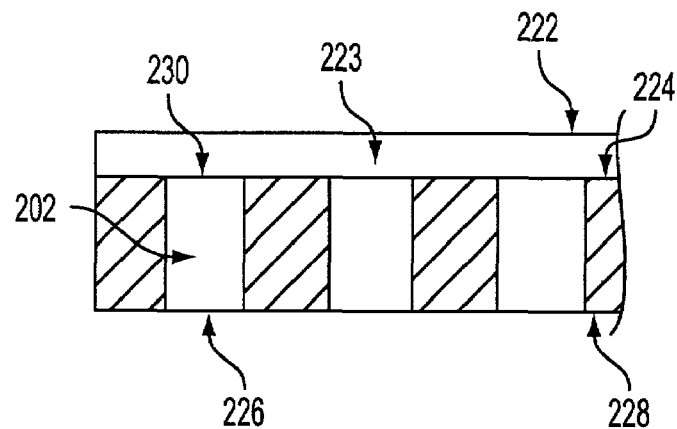

FIGS. 7A and 7B exemplify an embodiment of the mask plate 200 of the invention in plan view and partial cross-section respectively. The mask 200 comprises the channel system 201 comprising recessed channel regions 212 and raised polishing regions 214. The channel system 201 may preferably be comprised of more than one channel, such as a first channel 215 and a second channel 216, and more than one polishing region. Each channel 215, 216 is comprised of a closed end 217 and an open end 218. The closed ends 217 form a center 220 of the mask plate 200. The open ends 218 may also be shaped in other ways without adversely affecting the unique nature of the invention. Preferably, raised polishing regions 214 are comprised of a top surface 222 and a side wall 223. The side wall 223 elevates the top surface 222 from a surface 224 of the recessed region 212. The top surfaces 222 of the raised polishing regions 214 are preferably formed in a coplanar fashion. The top surfaces 222 sweep the wafer surface during the deposition.

Figure 8A:
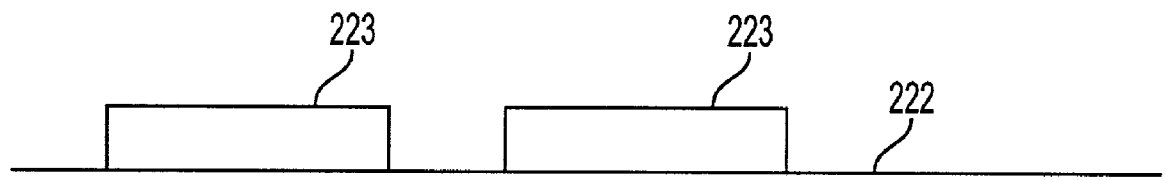
FIGS. 8A–8D illustrate in an enlarged view various shapes of features on raised regions within the polishing portion of the mask plate according to the present invention.
Figure 8B:
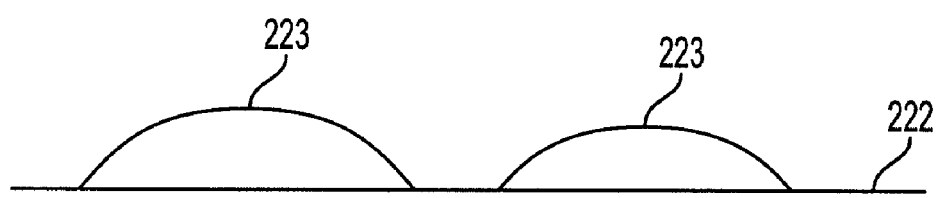
Figure 8C:
Figure 8D:
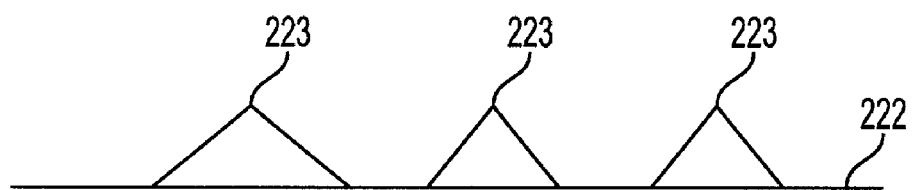

In this embodiment, the holes 202 within the channel regions 215, 216 are formed with a shape that the inner and outer walls correspond to the are at a given radius from the center of the mask plate 200, and are progressively smaller in size as they get closer to the center of the mask, and are distributed on opposite sides from the center of the mask in a staggered manner (hole 202a lines up with space 203a as shown) to ensure that the entire wafer 108 will receive a uniform application of electrolyte. As shown in FIGS. 8–8D, the top surface 222 of the raised regions 214 may be designed to have a plurality of very small circular, rectangular, bump, round, or triangular shape features. While the top surface 222 may appear smooth as seen from a distance, close inspection will show that the top surface is made up of many of these small shaped features. Such features may comprise abrasives on them, and can also contain abrasives within them, so as the top surface 222 becomes worn, abrasives still exist which can contact the wafer. Alternatively, the top surfaces 222 may be shaped as rectangular, bump, round or triangular. These shapes improve the sweeping action on the wafer surface.

Holes 202 are formed into the recessed regions 212. Referring back to FIG. 7B, the holes 202 may extend between a bottom opening 226 in a bottom surface 228 of the mask 200 and a top opening 230 in the surface 224 of the recessed region 212, and put the bottom surface 228 and the surface 224 in fluid communication. As shown in FIG. 7A, the holes 202 in the channels are distributed radially but in a staggered manner so that the holes 202 in channel 215 and the holes in channel 216 are not symmetrical, as described above. For example, a first hole 202a in channel 215 corresponds to a first space 203a in channel 216. Similarly, a second hole 202b in channel 215 corresponds to a second space 203b in channel 216, and so on. In other words, if the holes 202 in channel 215 were rotated by 180 degrees about the center 220 and over the channel 216, a fully open channel would be formed. Such staggered distribution of holes on the plate 200 allows the metal, such as copper, to deposit onto a wafer uniformly as the wafer is rotated. The shape of the holes 202 along the channels 215, 216 as well as shapes of the channels 215, 216 themselves may be changed based on the electrolyte flow rate. In comparison to the higher electrolyte flow near the edge of the mask plate, the electrolyte flow rate is lower near the center of the mask plate.

Figure 9:
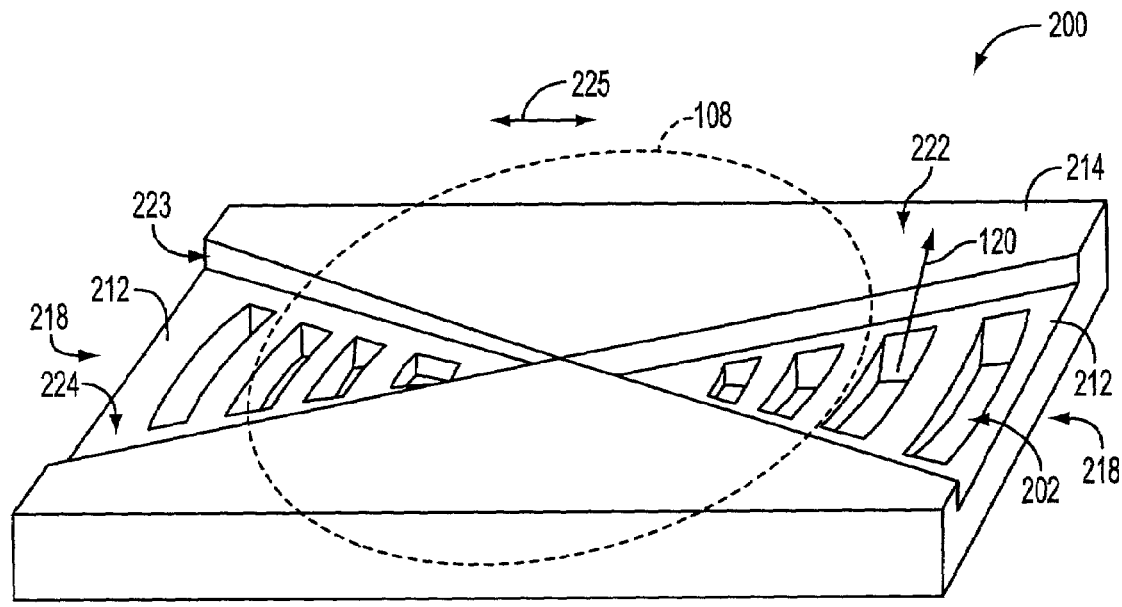
FIG. 9 illustrates a wafer located over the mask plate illustrated in FIG. 7A.

FIG. 9 shows the mask plate 200 on which the wafer 108 is placed. During an initial stage of the deposition process, the wafer 108 is brought to close proximity to but not touching the mask 200 and is rotated, and laterally moved in the direction 225. The electrolyte 120 flows through the holes 202 into the channels 215, 216 and wets the entire front surface of the wafer 108. At his stage of the process, small features, such as vias on the surface of the wafer 108 are filled. In the following stage of the process, the wafer is contacted to the top surface 222 of the raised regions 214. The electrolyte 120 fills the channels 215, 216, wets the front surface of the wafer 108 corresponding thereto, and flows out of the mask 200 through the open edge 218 of the channels 215, 216. As the wafer 108 rotates, the raised regions 214 on the mask 200 apply a sweeping action on the front surface of the wafer 108. Sweeping action generated by the raised surfaces 214, in conjunction with the depositing that takes place when the channels 215 and 216 are exposed to the large features, such as trenches, channels on the front surface of the wafer 108, fills these features. The width, height and the length of the raised regions 214 may be varied. The mask 200 may have wide recessed regions comprising large or small holes and narrow raised regions 214.

The channels 215, 216 on the mask 200 allows electrolyte 120 to be in continuous contact with a portion of the wafer surface when the mask 200 is in contact with the wafer 108, and the electrolyte 120 is flowing at a relatively high flow rate so that any particulates or impurities that may be generated during the process are washed out of the surface of the wafer 108, without adversely affecting the properties of the deposited film. Additionally, the pressure of the electrolyte increases lubrication over the wafer surface; therefore, possibility of getting the wafer surface scratched by contacting the raised surfaces is minimized. The channels 215, 216 also lubricate the surface and make planar deposition very efficient and the deposited metal quality better. Presence of the channels 215, 216 on the mask plate 200 releases electrolyte pressure and thus improves contact between the wafer surface and the top surface 222 of the raised regions. This allows use of higher electrolyte flows, better washing and lubricating of the wafer surface without sacrificing planarity and uniformity.

In an alternative embodiment of the process, at least one additive or a combination of additives may be added to the electrolyte 120, as described more fully in U.S. application Ser. No. 09/740,701, now U.S. Pat. No. 6,534,116 entitled "Plating Method and Apparatus that Creates a Differential Between Additive Disposed on a Top Surface and a Cavity Surface of a Workpiece Using an External Influence. In such case, initially, the wafer 108 is kept in close proximity and the front surface of the wafer 108 is plated as in the manner described above. Subsequently, the wafer 108 is rotated so as to do both sweeping of the top surface of the wafer 108, with the raised regions 214 and plating within features in the wafer 108 such as vias or trenches at the same time. However, application of sweeping action causes additive concentration to diminish rapidly at the top surface of the wafer 108 where the sweeping action is substantially effective. At the bottom of the features or in the features, the additive concentration remains about the same. The created concentration gradient between the top and the bottom of the features advantageously increase the deposition rate in the features while reducing the deposition rate at the top surface of the wafer.

If the plating process is carried out periodically or with pulses that coincide with the maintenance of the concentration gradient, by sweeping to establish the concentration gradient and then plating while the concentration gradient is maintained, in a cyclic manner, (which can also include raising and lowering the wafer 108 on the mask plate 200 in a cyclic manner), uniform deposition of the metal on the front surface of the wafer 108 is achieved. Further, plating can initially occur without the establishment of the concentration gradient, and then transition to the cyclic sweeping and plating process described. This may be done mechanically by moving the wafer holder toward the wafer 108. In another embodiment, however, such motion may be generated by pulsing the electrolyte by increasing its flow pressure periodically and thereby increasing the pressure on the rotating wafer. Resulting high pressure flow pushes the rotating wafer away and reduces the effect of the sweeping action. In the above embodiments the mask 200 may be smaller or larger than the wafer 108.

Figure 10:
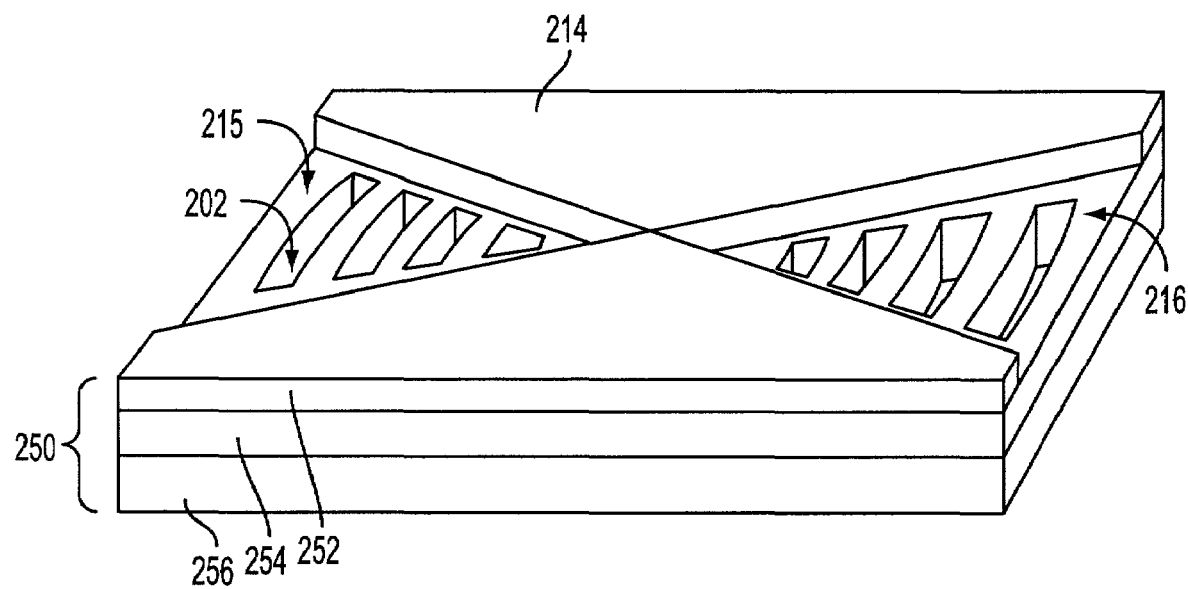
FIG. 10 illustrates the structure of the mask plate illustrated in FIG. 7A.

As shown in FIG. 10, the mask plate 200 may be made of a composite structure 250 having more than one layer. The other mask plates illustrated herein may also have this same composite structure. The plate for 200 millimeters (mm) wafer processing can be 140–190 mm wide and 200–400 mm long, preferably 160–180 mm wide and 200–300 mm long. For larger wafers, larger plates need to be used. The composite structure 250 comprises a top layer 252, an intermediate layer 254 and a bottom layer 256. The raised regions 214 and the channels 215, 216 are formed or defined into the top layer 252 of the composite structure 250. The top layer 252 may preferably be made of a fixed abrasive pad film that is commercially available from 3M corporation or other materials such as IC-1000 pad layer that is available from Rodel Inc., or LPS or ESM pad layers that are available from Universal Photonics Inc. The top layer may have thickness range of about 25 micrometers to 5 mm, preferably in the range of 150 micrometers to 3 mm. The top layer 252 may be attached to the intermediate layer 254 using an adhesive film or adhesive layer.

The intermediate layer 254 is the mounting layer for the top layer 252 and the holes 202 are defined in the intermediate layer 254. The intermediate layer 254 may be made of a hard plastic material such as polycarbonate. Thickness of the intermediate layer 254 may be in the range of 250 micrometers to 5 mm, preferably 500 micrometers to 2 mm. The intermediate layer may preferably be made of an insulator, although it may be made of a conductive material.

It is important that the selected material be stable in the chemical solutions used during the process.

The bottom layer 256 functions as a cushion layer for the mask 200 wherein the holes 202 continue in the bottom layer 256. The bottom layer 256 may preferably be a plyable layer and made of spongy plastic material such as polyurethane or polypropylene, or the like. The thickness of the bottom layer 256 may be in the range of 1 mm to 10 mm. The bottom layer 256 may not be needed if a plyable layer is employed behind the wafer. The layers 252, 254 and 256 are attached together using conventional attachment means such as adhesive tape or adhesive layer.

Figure 11:
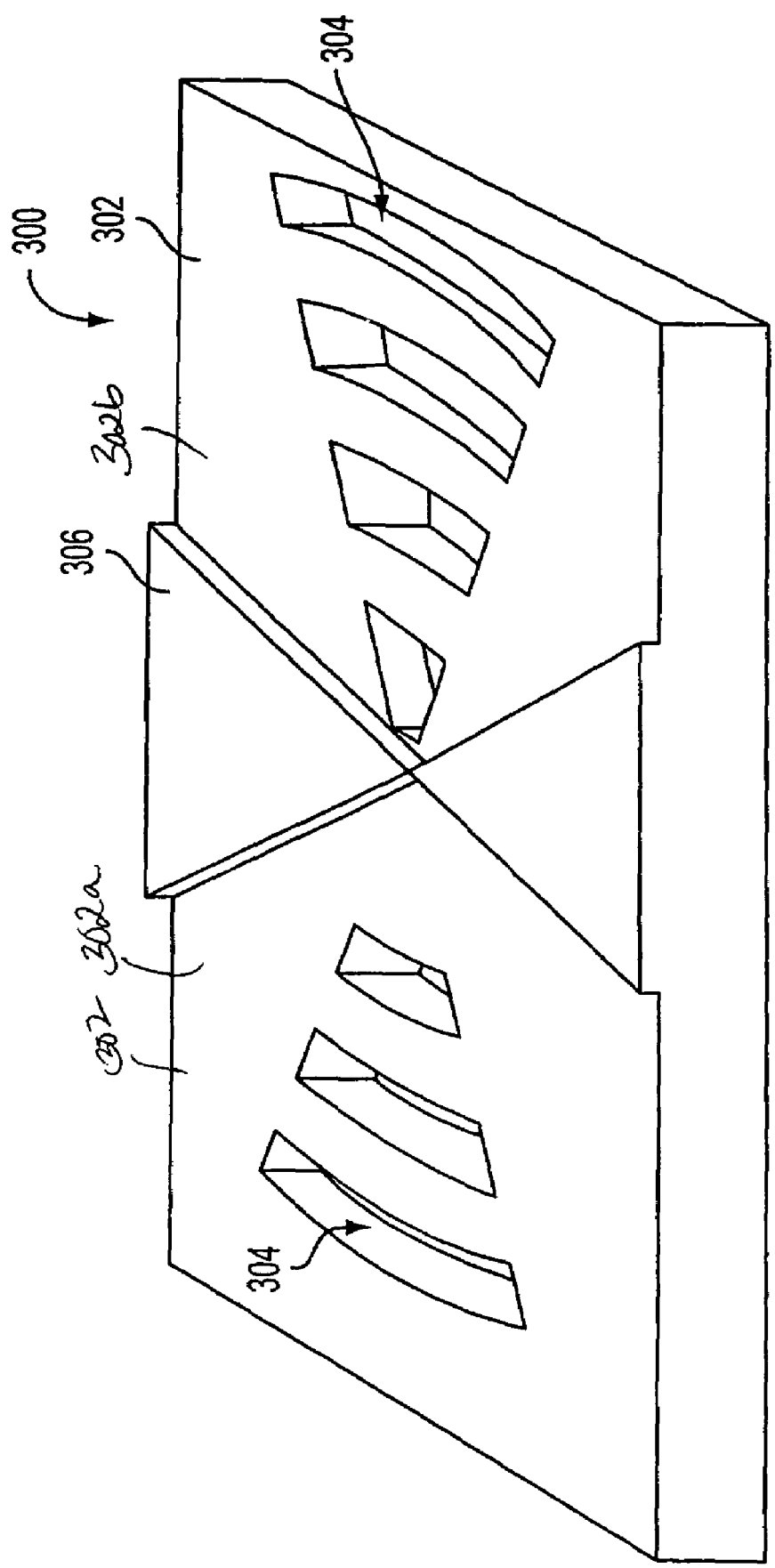
FIG. 11 illustrates another mask plate according to the present invention.

As exemplified in FIG. 11, in an alternative embodiment, a mask 300 may have a recessed region 302 with radial channels 302a and 302b having holes 304. Narrow raised polishing regions 306 separate the channels 302a and 302b from one another. The holes in the mask plate 300 are again distributed in a staggered fashion for deposition uniformity on the rotating wafer, as described above. With the narrow raised polishing regions 306, the flow of electrolyte through the channels 302a, 302b increase and the physical sweeping action induced by the raised polishing region onto the wafer surface is reduced.

Figure 12:
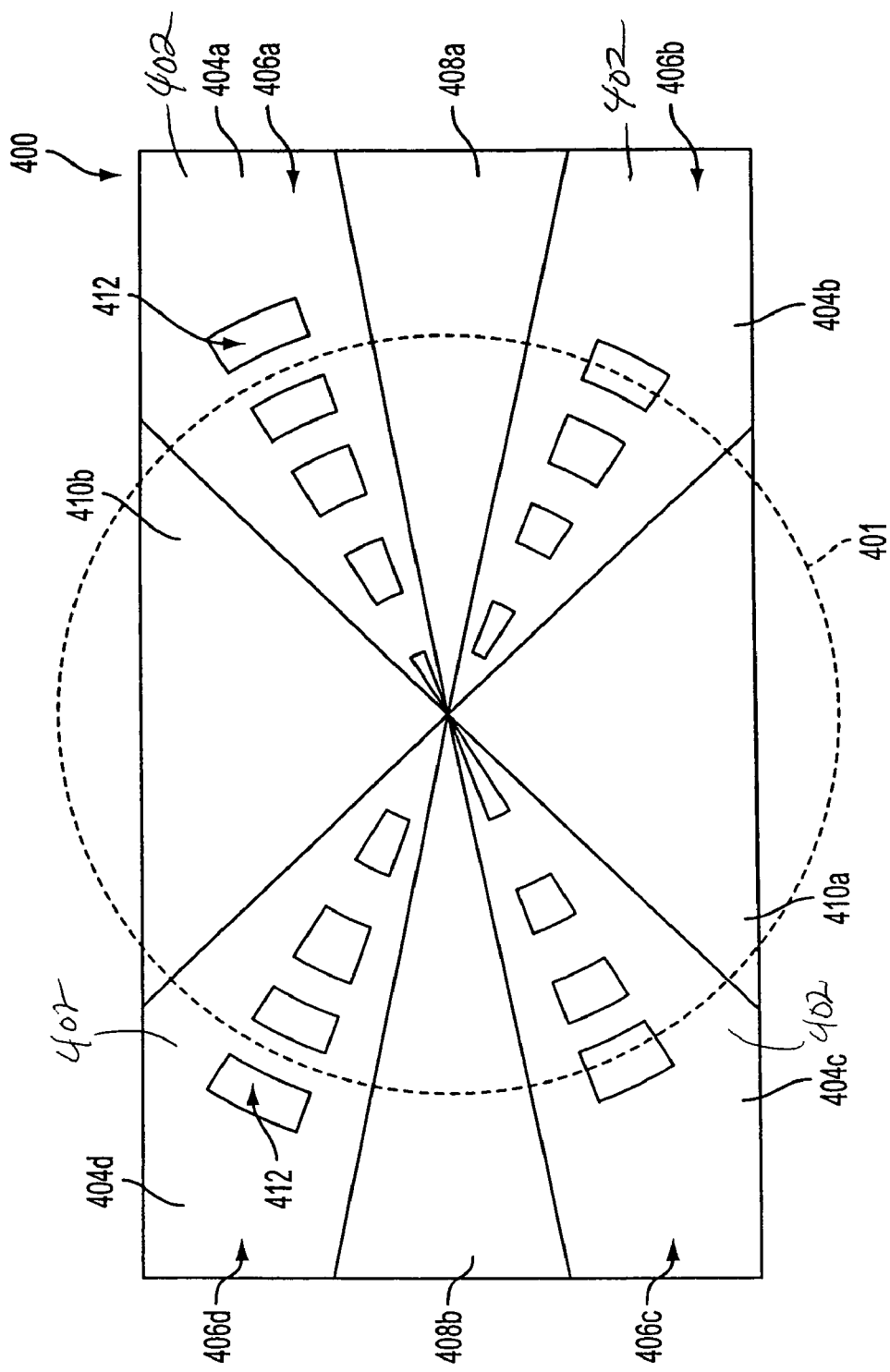
FIG. 12 illustrates yet another mask plate according to the present invention
Figure 13A:
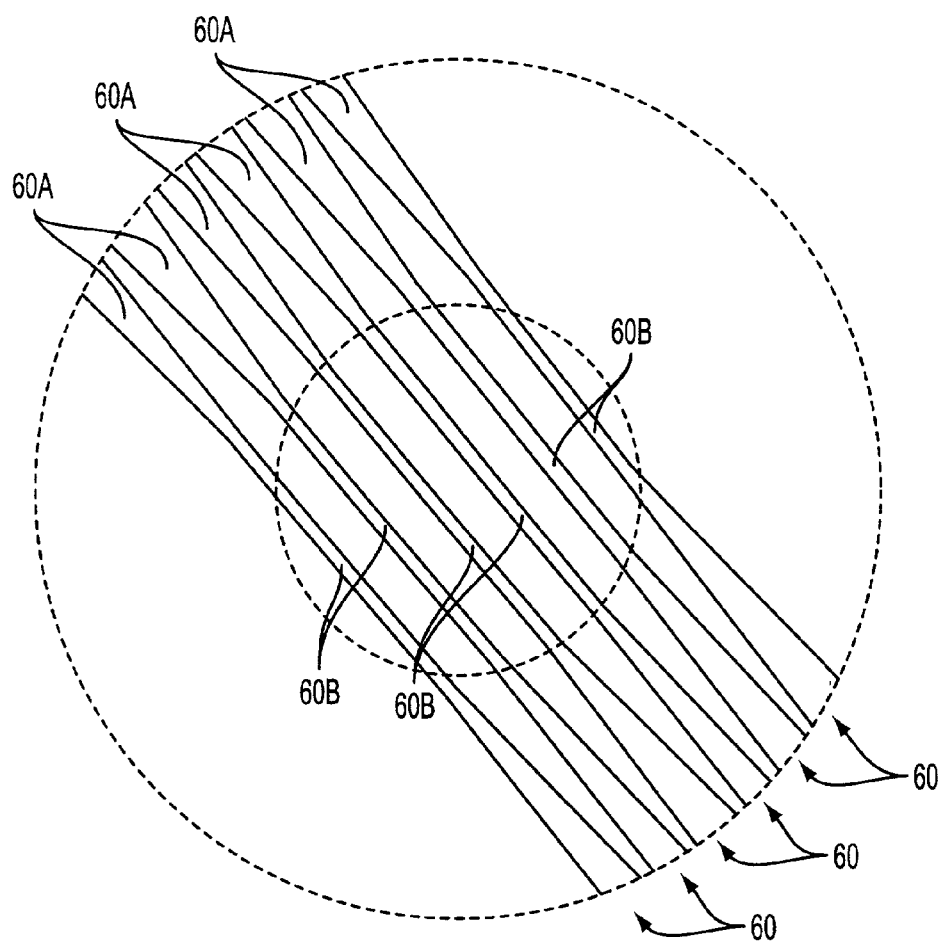
FIGS. 13A–13D illustrate portions of other mask plates according to the present invention.
Figure 13B:
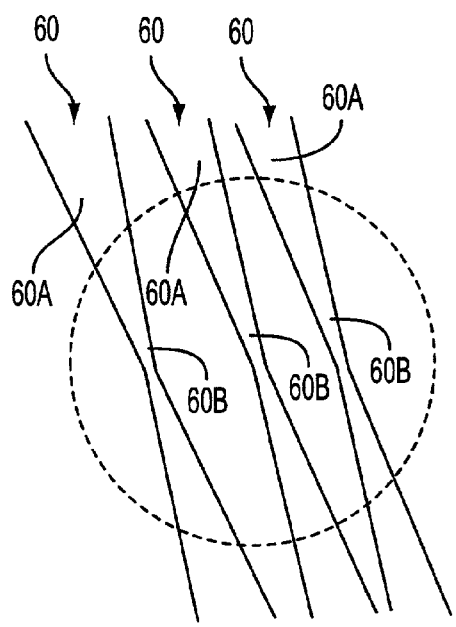
Figure 13C:
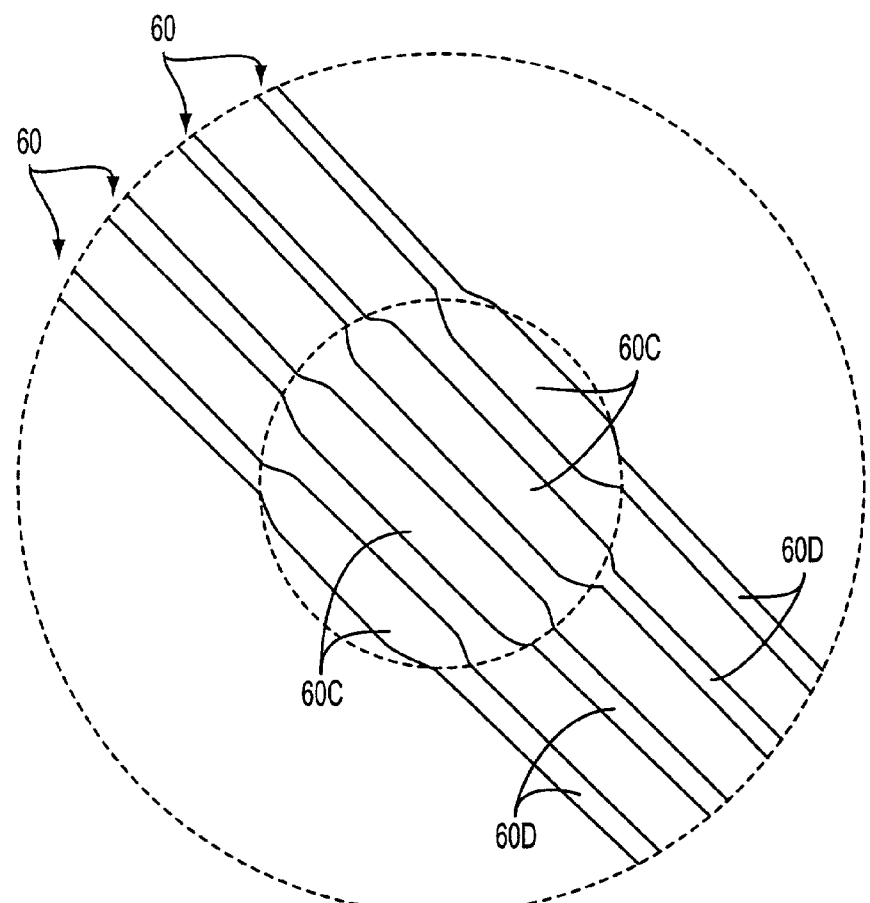
Figure 13D:
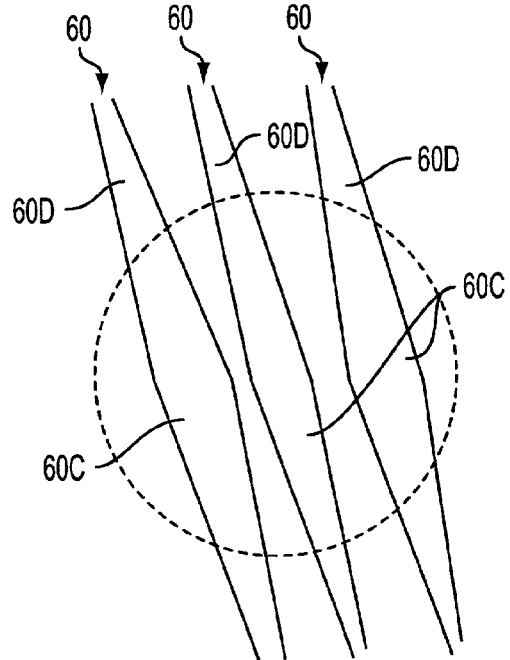

As shown in FIG. 12, in another alternative embodiment 400 of a mask plate of the present invention having upon which a wafer 401 placed. The mask plate 400 comprises a channel system 402 having radial channels 404a–404d. The channels 404a-404d comprise recessed regions 406a–406d. In this embodiment, the raised polishing regions may have differing shapes. For example, raised regions 408a and 408b each have a narrow top surface while raised regions 410a and 410b each have a broader top surface. The holes 412 in the mask plate 400 are again distributed in a radial and staggered manner. It should be noted that the holes 412 are preferably distributed in directions that make small angles with the direction X. This is acceptable because the preferred shape of the mask has longer dimension along the X direction. However, some holes may be distributed in the area defined by the raised regions 410a, 410b.

Figure 14:
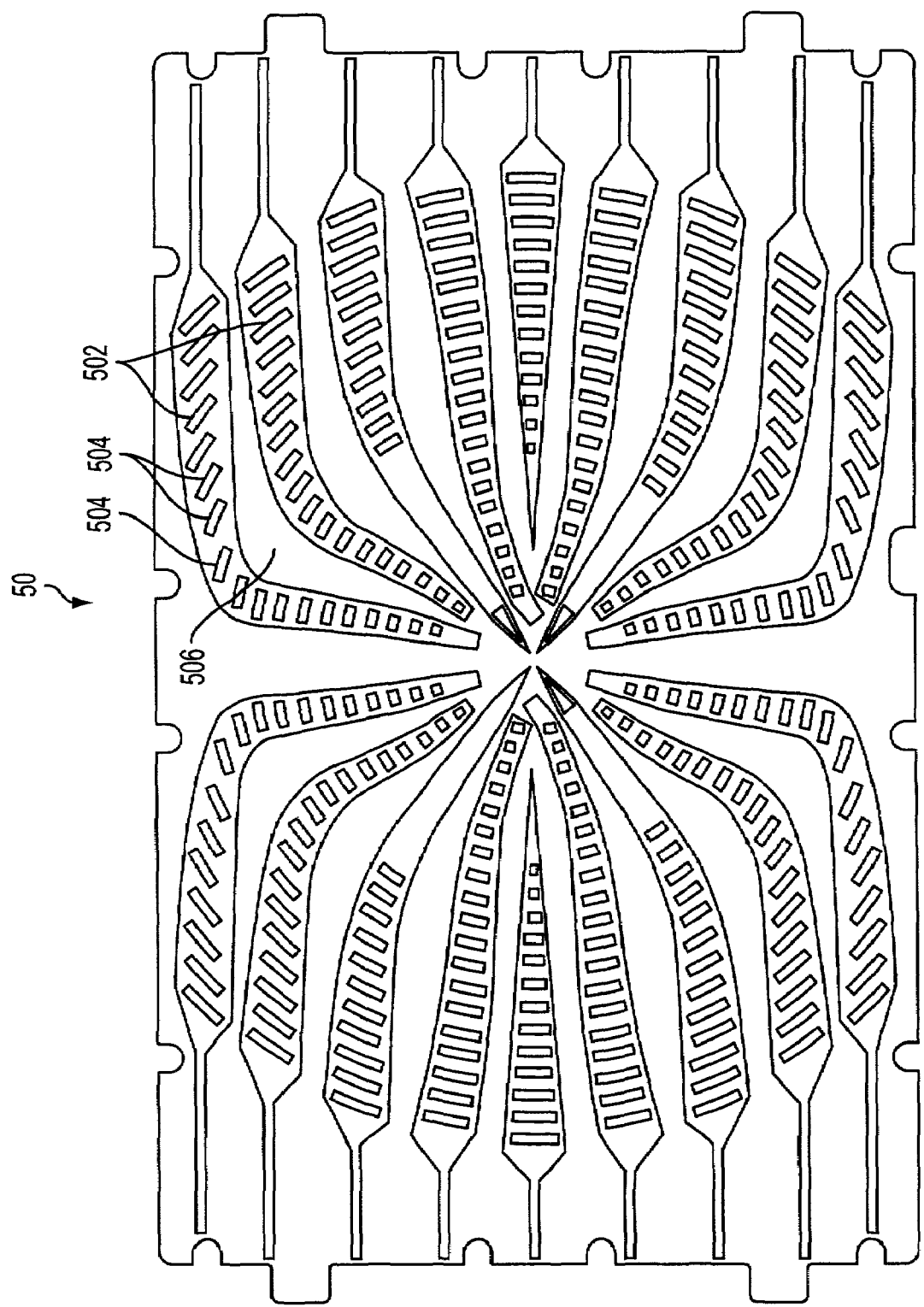
FIG. 14 illustrates a top view of another mask plate according to the present invention.

FIGS. 13A–13D illustrate other embodiments of mask plates that each include a plurality of channels 60, with each of the channels 60 functioning like the channels 60 previously described, for example with respect to FIG. 5C. In a manner similar to the channels 60 illustrated in FIG. 5C which have different widths at different portions of the mask plate so that a greater relative amount of processing can occur at areas where there is a wider channel width, it is apparent that in FIGS. 13A and 13B that the wider channel portions 60A along the perimeter of the mask plate than the channel portions 60B in the inner region of the mask plate will provide for a greater relative amount of processing at the perimeter regions of a workpiece corresponding thereto, whereas in the in FIGS. 13C and 13D that the wider channel portions 60C along the inner region of the mask plate than the channel portions 60D in the perimeter of the mask plate will provide for a greater relative amount of processing at the inner regions of a workpiece corresponding thereto. As shown by the various shapes of channels, having the channel gradually change in its width along the length direction, a gradient in the relative amount of processing that occurs can be established FIG. 14 illustrates a particular embodiment 500 of a mask plate, that contains a plurality of channels 502, each having a plurality of holes 504 disposed within each channel, with the holes and channels configured to provide for a relatively equal amount of processing along the entire top surface of the workpiece. In between the channels 502 are raised polishing or contact regions 506, which raised polishing regions, as with the embodiments discussed previously, may or may not contain abrasive materials thereon, and will contact the top surface of the workpiece to provide a polishing or sweeping action when physical contact exists between the mask plate 500 and the workpiece, and relative movement occurs between the mask plate 500 and the workpiece during electrochemical processing.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the spirit and scope of the invention as set forth in the appended claims.

What is claimed is:

1. A mask plate apparatus for use in an electrochemical processing device in which a solution becomes disposed onto a workpiece and electrochemical processing of the workpiece is performed while relative movement and physical contact exists between the apparatus and a top surface of the workpiece, the apparatus comprising:
a pad having a top surface and a bottom surface, the top surface including a processing area that aligns with the workpiece;
a plurality of channels formed in the top surface of the pad within the processing area:
at least one contact portion formed in the top surface of the pad at a location different than the plurality of channels;
at least one hole disposed between the top surface and the bottom surface of the pad within each of the plurality of channels so that the solution can flow therethrough and into each of the plurality of channels when the physical contact exists with the workpiece, wherein each of the plurality of channels further includes an edge channel portion adapted to allow the solution to flow therethrough and out of the channels when the physical contact exists with the workpiece, wherein the plurality of channels are arranged to allow a relatively greater amount of processing to occur on a center region of the workpiece than an edge region of the workpiece, and wherein each of the plurality of channels is parallel to each other, and each of the plurality of parallel channels has a greater width in a center portion of the pad corresponding to the center region of the workpiece.

2. The apparatus according to claim 1, wherein the plurality of channels are disposed radially from the center portion of the pad to an edge portion of the pad.

3. The apparatus according to claim 2, wherein a plurality of holes are disposed between the top surface and the bottom surface of the pad within each channel.

4. The apparatus according to claim 3 wherein the plurality of holes are dimensioned to provide a greater flow of the solution at an edge portion of the pad than in the center portion of the pad.

5. The apparatus according to claim 4 wherein those holes that are disposed in the center portion of the pad are smaller than other holes disposed in the edge portion of the pad.

6. The apparatus according to claim 2 wherein the channels are V shaped.

7. The apparatus according to claim 3, wherein holes that are disposed in the center portion of the pad are smaller than other holes disposed in the edge portion of the pad.

8. The apparatus according to claim 3, wherein the holes have four sides, two opposite sides being parallel to edges of the channel, and the other two opposite sides having a shape corresponding to a radius from a corresponding center portion of the pad.

9. The apparatus according to claim 1, wherein the at least one hole in each of the plurality of channels is a slit.

10. The apparatus according to claim 9 wherein each slit extends past the edge region of the workpiece to allow the solution to flow therethrough and out of the channel when the physical contact exists with the workpiece.

11. A mask plate apparatus for use in an electrochemical processing device in which a solution becomes disposed onto a workpiece and electrochemical processing of the workpiece is performed while relative movement and physical contact exists between the apparatus and a top surface of the workpiece, the apparatus comprising:
a pad having a top surface and a bottom surface, the top surface including a processing area that aligns with the workpiece;
a plurality of channels formed in the top surface of the pad within the processing area:
at least one contact portion formed in the top surface of the pad at a location different than the plurality of channels; and
at least one hole disposed between the top surface and the bottom surface of the pad within each of the plurality of channels so that the solution can flow therethrough and into each of the plurality of channels when the physical contact exists with the workpiece, wherein each of the plurality of channels further includes an edge channel portion adapted to allow the solution to flow therethrough and out of the channel when the physical contact exists with the workpiece and wherein the plurality of channels are arranged to allow a relatively greater amount of processing to occur on an edge region of the workpiece than a center region of the workpiece, and wherein each of the plurality of channels are parallel to each other, and each of the plurality of parallel channels has a greater width in an edge portion of the pad corresponding to the edge region of the workpiece.

12. The apparatus according to claim 11, wherein the at least one hole is a slit.

13. The apparatus according to claim 12 wherein substantially an entirety of each of the plurality of channels includes the slit.

14. The apparatus according to claim 11, wherein the at least one contact portion includes abrasive materials disposed thereon.

15. An electrochemical processing device in which a solution becomes disposed onto a workpiece and electrochemical processing of the workpiece is performed, the apparatus comprising:
a terminal adapted to receive an electrical potential;
at least one electrical contact adapted to establish electrical contact with the workpiece and receive another electric potential, and thereby adapted to establish a potential difference between the terminal and the workpiece so that electrochemical processing can occur in the presence of the solution; and
a mask plate adapted to establish physical contact with the workpiece during a portion of the electrochemical processing and located adjacent to the at least one electrical contact, such that relative movement of the mask plate and the workpiece causes an edge contact region of the workpiece to maintain electrical contact with an edge region of the workpiece while still allowing for the electrochemical processing to occur on a full face of the workpiece, the mask plate including:
a pad having a top surface and a bottom surface, the top surface including a processing area that aligns with the workpiece;
at least one channel formed in the top surface of the pad within the processing area, the at least one channel configured to allow a substantially equal amount of processing to occur on a center region of the workpiece and the edge region of the workpiece, wherein the at least one channel further includes an edge channel portion adapted to allow the solution to flow therethrough and out of the channel when the physical contact exists with the workpiece;
at least one contact portion formed in the top surface of the pad at a location different than the at least one channel; and
at least one hole disposed between the top surface and the bottom surface of the pad within the at least one channel so that the solution can flow therethrough and into the at least one channel when the physical contact exists with the workpiece, wherein a plurality of the at least one channel are parallel channels and have a greater width in an edge portion of the pad corresponding to the edge contact region of the workpiece that does not always remain in physical contact with the pad.

16. The device according to claim 15, further including at least two electrical contacts adapted to establish electrical contact with the workpiece and receive another electric potential, wherein the mask plate is adjacent to each electrical contact.

17. The device according to claim 16 wherein the mask plate is substantially rectangular, and the at least two electrical contacts are disposed on opposite sides of the mask plate.

18. The device according to claim 15, wherein the at least one hole in the at least one channel is a slit.

19. The device according to claim 18 wherein the slit extends past an edge region of the workpiece to allow the solution to flow therethrough and out of the channel when the physical contact exists with the workpiece.

20. A mask plate apparatus for use in an electrochemical processing device in which a solution becomes disposed onto a workpiece and electrochemical processing of the workpiece is performed while relative movement and physical contact exists between the apparatus and a top surface of the workpiece, the apparatus comprising:
a pad having a top surface and a bottom surface, the top surface including a processing area that aligns with the workpiece;
a plurality of channels formed in the top surface of the pad within the processing area, the plurality of channels configured to allow a relatively greater amount of processing to occur on one region of the workpiece than another region of the workpiece, wherein the one region is a center region of the workpiece and the another region is an edge region of the workpiece;
at least one contact portion formed in the top surface of the pad at a location different than the plurality of channels;
at least one hole disposed between the top surface and the bottom surface of the pad within each of the plurality of channels so that the solution can flow therethrough and into each of the plurality of channels when the physical contact exists with the workpiece, wherein each of the plurality of channels are parallel to each other; and each of the plurality of parallel channels has a greater width in a center portion of the pad corresponding to the center region of the workpiece.

21. The apparatus according to claim 20, wherein each of the plurality of channels has a gradually changing width between the center portion of the pad and an edge portion of the pad.

22. The apparatus according to claim 20, wherein each of the plurality of channels is V-shaped.

23. The apparatus according to claim 20, wherein the at least one hole in each of the plurality of channels is a slit.

24. The apparatus according to claim 23 wherein each slit extends past the edge region of the workpiece to allow the solution to flow therethrough and out of the channel when the physical contact exists with the workpiece.

25. The apparatus according to claim 20, wherein the width of the at least one of the channels is reduced as the channel extends away from the center portion of the pad.

26. A mask plate apparatus for use in an electrochemical processing device in which a solution becomes disposed onto a workpiece and electrochemical processing of the workpiece is performed while relative movement and physical contact exists between the apparatus and a top surface of the workpiece, the apparatus comprising:
 a pad having a top surface and a bottom surface, the top surface including a processing area that aligns with the workpiece;
 a plurality of channels formed in the top surface of the pad within the processing area, the plurality of channels configured to allow a relatively greater amount of processing to occur on one region of the workpiece than another region of the workpiece, wherein the one region is an edge region of the workpiece and the another region is a center region of the workpiece;
 at least one contact portion formed in the top surface of the pad at a location different than the plurality of channels;
 at least one hole disposed between the top surface and the bottom surface of the pad within each of the plurality of channels so that the solution can flow therethrough and into each of the plurality of channels when the physical contact exists with the workpiece, wherein each of the plurality of channels is parallel to each other, and each of the plurality of parallel channels has a greater width in an edge portion of the pad corresponding to the edge region of the workpiece.

27. The apparatus according to claim 26, wherein the width of each channel is increased as the channel extends towards the edge portion of the pad.

28. The apparatus according to claim 26, wherein each of the plurality of channels has a gradually changing width between a center portion of the pad and the edge portion of the pad.

29. The apparatus according to claim 26, wherein each of the plurality of channels are parallel to each other.

30. The apparatus according to claim 26, wherein the at least one hole in each of the plurality of channels is a slit.

31. The apparatus according to claim 30, wherein each slit extends past the edge region of the workpiece to allow the solution to flow therethrough and out of the channel when the physical contact exists with the workpiece.

* * * * *